United States Patent
Liang et al.

(10) Patent No.: US 6,248,659 B1
(45) Date of Patent: Jun. 19, 2001

(54) METHOD FOR FORMING AN INTERCONNECT STRUCTURE

(75) Inventors: Randall Cha Cher Liang, Singapore (SG); Lap Chan, San Francisco, CA (US)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 0 days.

(21) Appl. No.: 09/441,811

(22) Filed: Nov. 17, 1999

(51) Int. Cl.$^7$ .................. H01L 21/4763; H01L 21/44
(52) U.S. Cl. .................. 438/622; 438/618; 438/778; 438/787; 438/691; 438/942; 438/943; 438/945
(58) Field of Search ................... 438/787, 780, 438/791, 781, 778, 942, 943, 944–946, 958, 618, 631, 687, 633, 691, 622

(56) References Cited

U.S. PATENT DOCUMENTS 5,899,737 * 5/1999 Trabucco .......................... 438/615

OTHER PUBLICATIONS

A Novel Technology to Form Air Gap for ULSI Application, by Chang et al., IEEE Electron Device Letters, vol. 20, No. 4, Apr. 1999, pp. 185–187.

Theoretical Study of Structural and Electronic Properties of H–Silsesquioxanes, by Xiang et al., J. Phys. Chem. B, vol. 102, No. 44, 1998, pp. 8704–8711.

Cage–rearrangement of silsesquioxanes, by Rikowski et al., Polyhedron vol. 16, No. 19, 1997. pp. 3357–3361.

* cited by examiner

Primary Examiner—John F. Niebling
Assistant Examiner—Ha Tran Nguyen
(74) Attorney, Agent, or Firm—Wagner, Murabito & Hao LLP

(57) ABSTRACT

In one embodiment, a masking chuck (68) is placed in contact with an integrated circuit structure (70) that contains conductive members (90). The masking chuck (68) is used to deposit a dielectric layer (92) on the integrated circuit structure (70). The dielectric layer (92) is then cured, and the masking chuck (68) is separated from the integrated circuit structure (68) to define openings (96) within the dielectric layer (92) which expose a portion of the underlying conductive members (90). A conductive layer (100) is then deposited in the openings (96), and polished to form conductive members (102) within the openings (96), which are electrically shorted to the underlying conductive members (90).

22 Claims, 14 Drawing Sheets

METHOD FOR FORMING AN INTERCONNECT STRUCTURE

FIELD OF THE INVENTION

The present invention relates to integrated circuit fabrication, and more specifically to a method for forming an interconnect structure.

BACKGROUND OF THE INVENTION

The semiconductor industry continually strives to increase device performance by reducing the distance between individual devices, and by reducing the size of the devices themselves. Unfortunately, this continuing reduction in device dimensions has begun to adversely effect the performance and the reliability of integrated circuits. More specifically, as the device density increases more levels of metallization are required to interconnect the different devices. The plasma processes currently used to form the various levels of metallization, however, often damage the scaled devices. For example, the plasma processes currently used to etch contact or via openings often cause the thin gate oxide used in high performance semiconductor devices to rupture.

Accordingly, a need exists for a method to form interconnect structures which minimizes process induced damage to the integrated circuit.

BRIEF DESCRIPTION OF THE DRAWINGS

The present invention may be more fully understood by a description of certain preferred embodiments in conjunction with the attached drawings in which.

DETAILED DESCRIPTION OF A PREFERRED EMBODIMENT

Figure 1:
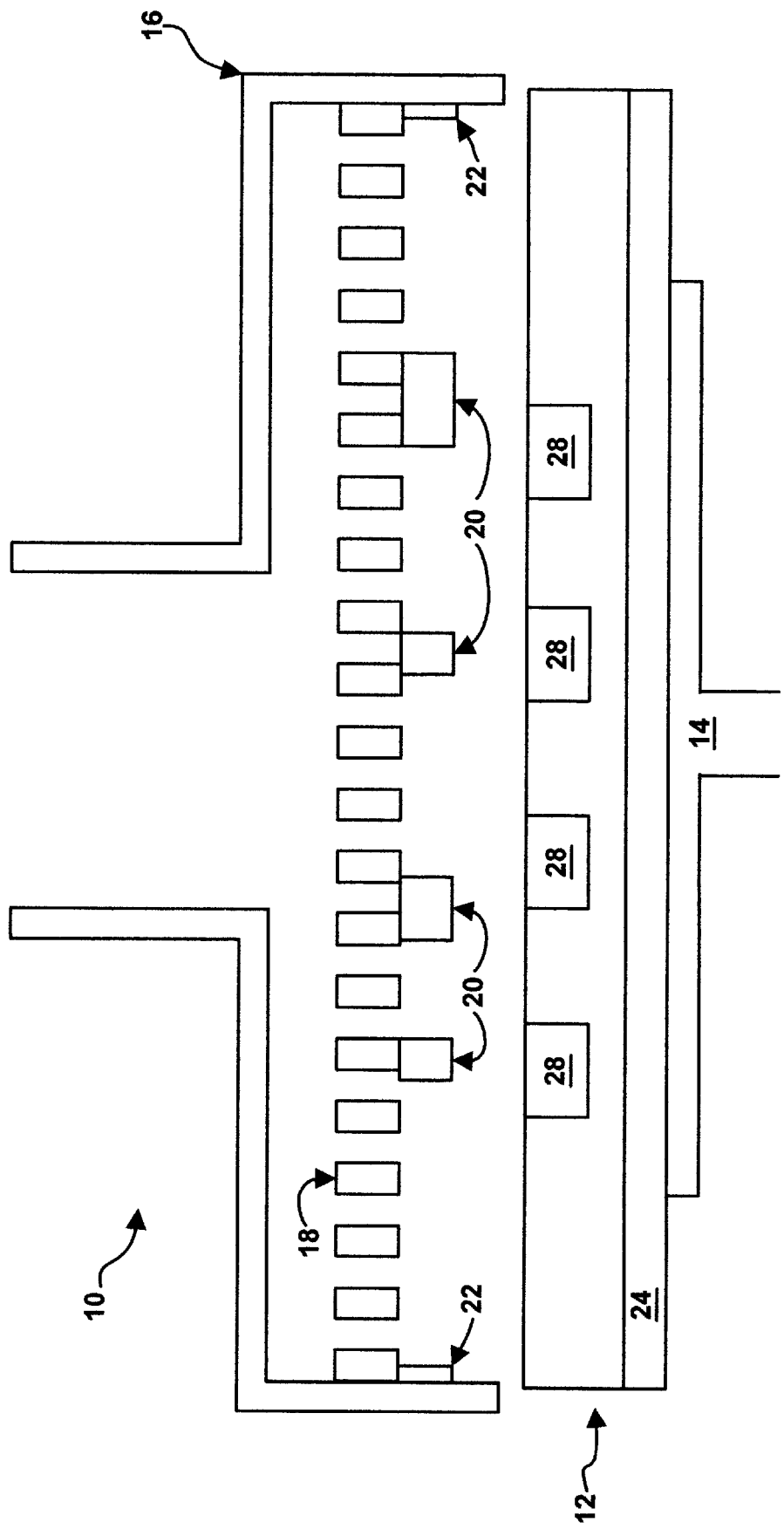
FIGS. 1–9 illustrate, in cross-section, process steps in accordance with one embodiment of the present invention.

FIGS. 1 through 10, illustrate in cross-section, process steps for forming an interconnect structure in accordance with one embodiment of the present invention. Shown in FIG. 1, is a portion of a masking chuck 10, a portion of an integrated circuit structure 12, and a portion of a substrate chuck 14.

In this particular embodiment, masking chuck 10 comprises a housing 16, a perforated plate 18, patterned masking regions 20, and an edge ring 22. In one embodiment, stainless steel is used to form housing 16 and perforated plate 18. In an alternative embodiment, perforated plate 18 is formed using silicon (Si) or silicon carbide (SiC). In one embodiment, patterned masking regions 20 and edge ring 22 are formed using polyimide, and conventional photolithographic patterning and etching processes are used to pattern the polyimide.

In this particular embodiment, integrated circuit structure 12 comprises a substrate 24, a dielectric layer 26, and conductive members 28. In one embodiment, substrate 24 is a semiconductor substrate, such as a monocrystalline silicon substrate, a silicon-on-insulator (SOI) substrate, a silicon-on-sapphire (SOS) substrate, a silicon-germanium substrate, or the like. In an alternative embodiment, substrate 24 is a printed circuit board. Dielectric layer 26 overlies substrate 24, and may be a layer of silicon dioxide, a layer of silicon nitride, a layer of boro-phosphate-silicate-glass (BPSG), a layer of phosphate-silicate-glass (PSG), a layer of spin-on-glass (SOG), a silicon oxynitride layer, or the like. In addition, dielectric layer 26 may be a composite dielectric layer comprising any combination of the foregoing dielectric materials. Conductive members 28 may be formed using a doped polysilicon layer, a metal layer such as aluminum, copper, tantalum or tungsten, a metal silicide layer such as tungsten silicide, titanium silicide or cobalt silicide, a metal nitride layer such as titanium nitride, tantalum nitride or tungsten nitride, or a combination thereof. In a preferred embodiment, conductive members 28 are substantially coplanar with dielectric layer 26, as shown in FIG. 1. It should be appreciated that conductive members 28 may be formed using conventional etching or polishing techniques, or a combination thereof.

Figure 2:
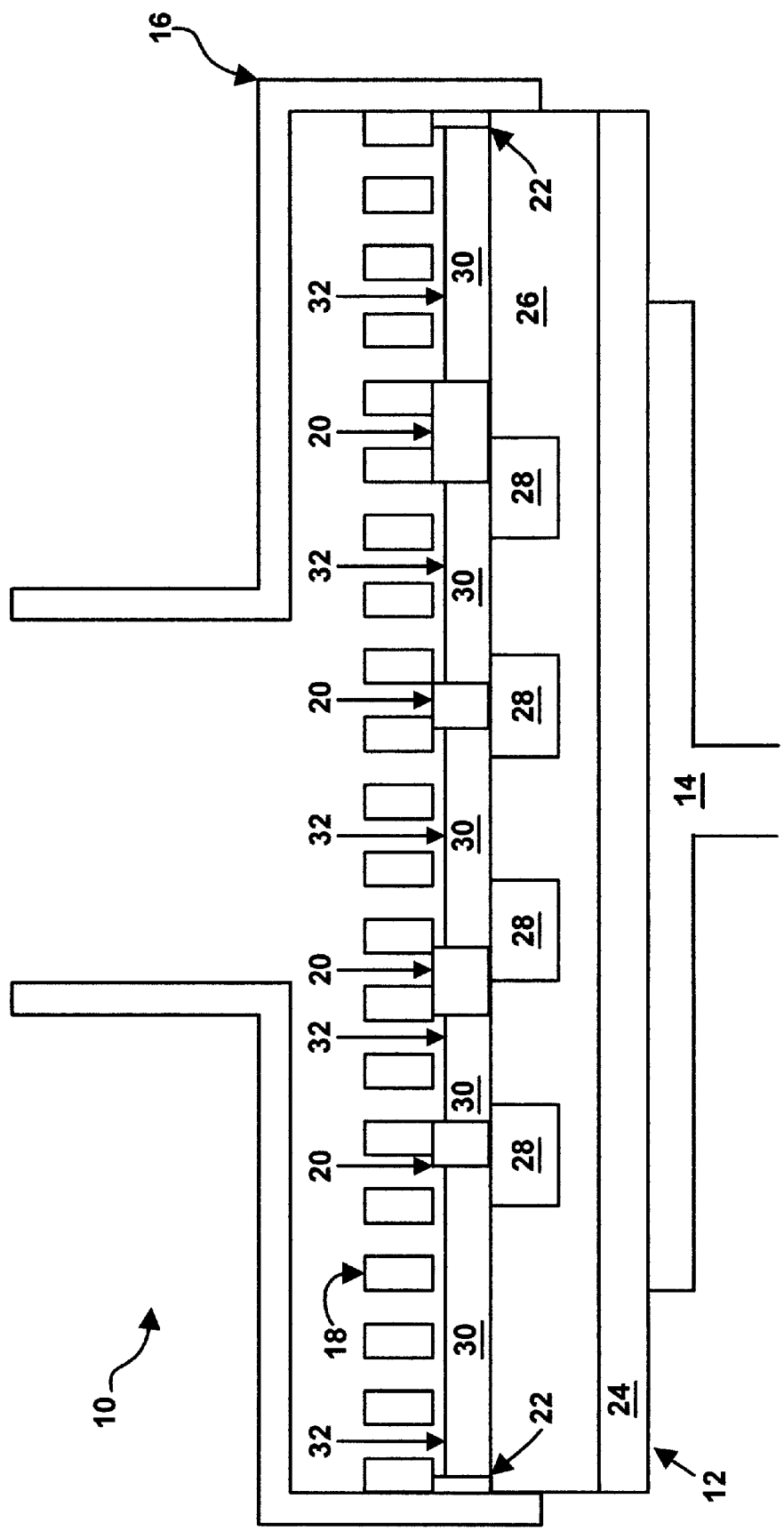

In FIG. 2, masking chuck 10 is placed in contact with integrated circuit structure 12, such that patterned masking regions 20 overlie and abut a portion of conductive members 28. Masking chuck 10 is aligned to integrated circuit structure 12 in a manner similar to that used to align a photomask to a semiconductor wafer. In one embodiment, integrated circuit structure 12 contains alignment marks (not shown) which are used in conjunction with a laser and a laser light detector to align masking chuck 10 to integrated circuit structure 12. Masking chuck 10 is then used to deposit a dielectric layer 30 over a portion of substrate 24. Note, a predetermined amount of dielectric material is deposited so that the gaps between patterned masking regions 20 are filled, and the top surface 32 of dielectric layer 30 lies below perforated plate 18, as shown in FIG. 2. In one embodiment, a hydrogen silsesquioxane (HSQ) based inorganic polymer is flowed through masking chuck 10 in order to form dielectric layer 30. It should be appreciated that integrated circuit structure 12 and masking chuck 10 may be rotated by substrate chuck 14 when dielectric layer 30 is deposited, so that dielectric layer 30 uniformly fills the gaps between patterned masking regions 20.

After deposition, dielectric layer 30 is then cured. In one embodiment, substrate chuck 14 comprises a resistive heater and dielectric layer 30 is heated by substrate chuck 14 in order to cure it. In one embodiment, masking chuck 10 also exposes dielectric layer 30 to an inert gas, such as nitrogen, argon, or helium, while it is heated. In an alternative embodiment, housing 16 comprises a resistive heater and dielectric layer 30 is heated by housing 16, while masking chuck 10 exposes it to an inert gas, such as nitrogen, argon, or helium. In the particular embodiment, wherein dielectric layer 30 is formed using a HSQ based inorganic polymer, dielectric layer 30 may be cured at a temperature ranging from approximately 350 degrees Celsius to approximately 450 degrees Celsius, in a nitrogen, argon, or helium atmosphere for a time period ranging from approximately 25 minutes to approximately 45 minutes. It should be appreciated that HSQ based inorganic polymers can also be cured using different curing times and temperatures.

Figure 3:
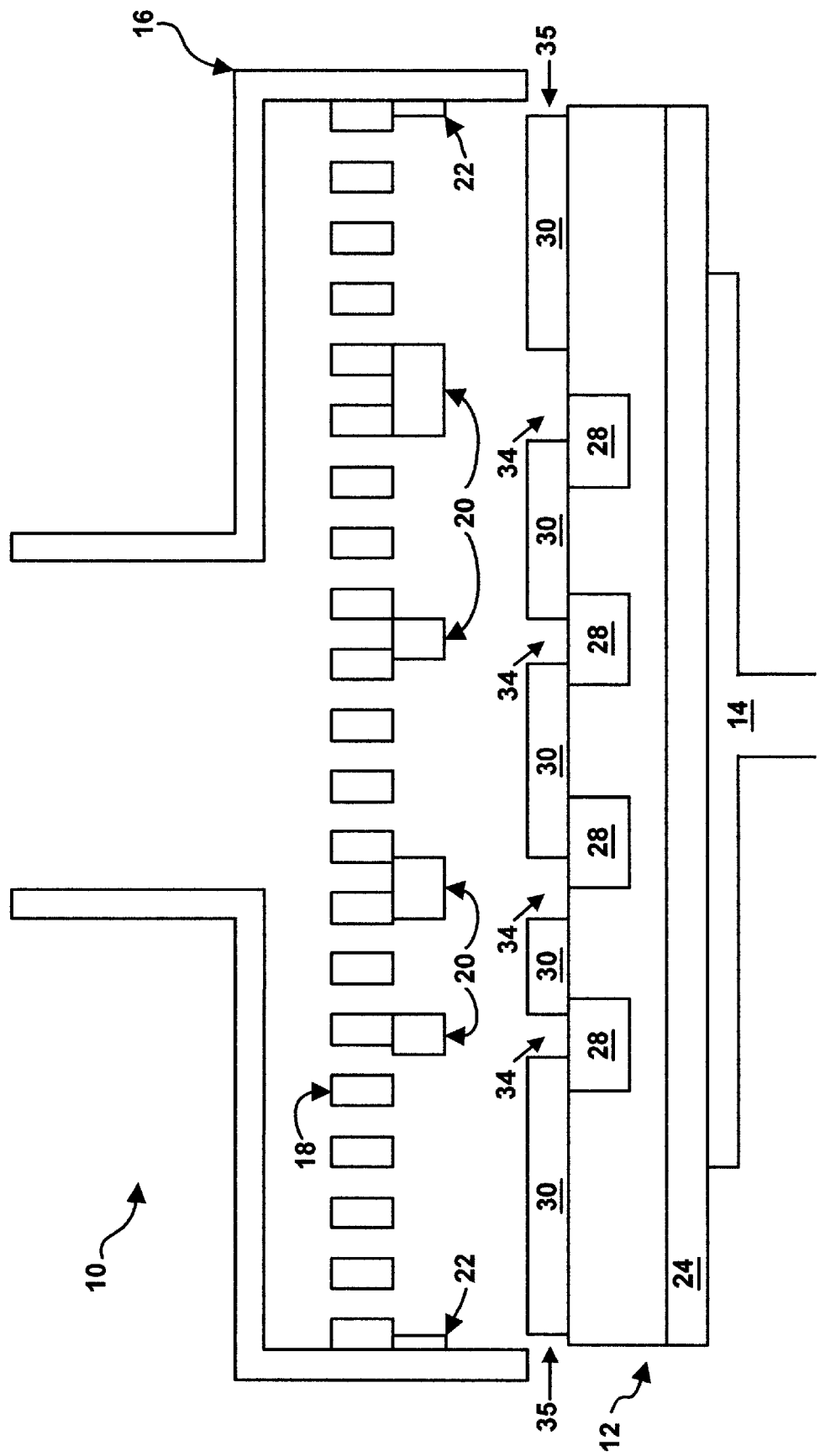

In FIG. 3, masking chuck 10 is then separated from integrated circuit structure 12 to form openings 34 within dielectric layer 30. Note, openings 34 are formed because dielectric layer 30 does not adhere to patterned masking regions 20. Note, dielectric layer 30 also does not adhere to edge ring 22, and thus a small gap 35 is also formed around the perimeter of integrated circuit structure 12 when masking chuck 10 is separated from integrated circuit structure 12, as shown in FIG. 3. It should be appreciated that edge ring 22 is used to separate housing 16 from dielectric layer 30, and thus if housing 16 is made of a material which does not adhere to dielectric layer 30, then edge ring 22 is not needed. For example, if the inner surface of housing 16 is coated with a layer of polyimide, then edge ring 22 is not needed because dielectric layer 30 will not adhere to the polyimide coated inner surface of housing 16. It is also important to note that openings 34 are formed without subjecting integrated circuit structure 12 to a plasma process. Therefore, plasma process induced damage to integrated circuit structure 12 is minimized with the present invention.

Figure 4:
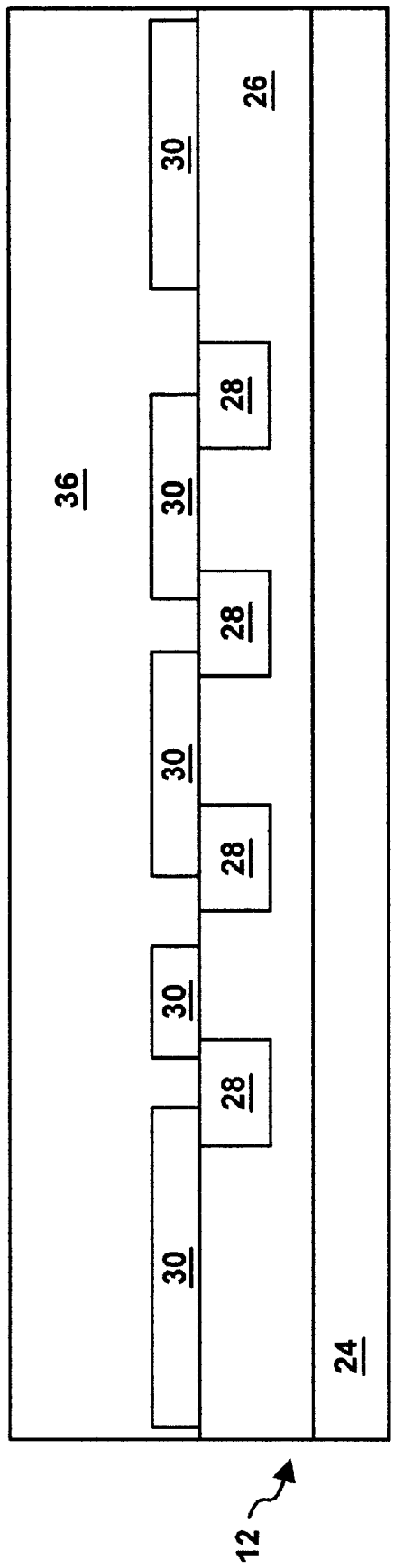

In FIG. 4, a conductive layer 36 is then formed overlying substrate 24. Conductive layer 36 overlies dielectric layer 30 and lies within openings 34, such that openings 34 are substantially filled by conductive layer 36. Conductive layer 36 may be a metal nitride layer, such as titanium nitride, tantalum nitride, tungsten nitride, tantalum-silicon nitride, or the like, or a metal layer, such titanium, tantalum, tungsten, aluminum, an aluminum-alloy, copper, or the like. In addition, conductive layer 36 may be a composite conductive layer comprising any combination of the foregoing conductive materials. For example, conductive layer 36 may be a composite layer of titanium nitride and tungsten, or a composite layer of tantalum nitride and copper.

Figure 5:
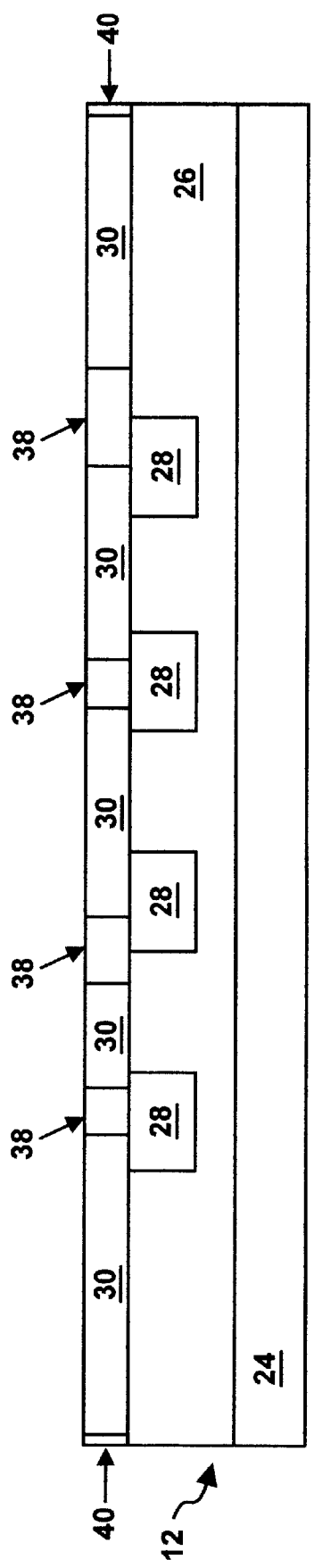

In FIG. 5, conductive layer 36 is then polished to form conductive members 38 within openings 34. In one embodiment, wherein conductive layer 36 is a composite layer of titanium nitride and tungsten, conductive layer 36 is polished using a slurry comprising ferric nitrate, deionized water, and a silica abrasive in order to form conductive members 38. Alternatively, the composite layer of tungsten and titanium nitride may also be polished using a slurry comprising hydrogen peroxide, deionized water, and a silica abrasive. In an alternative embodiment, wherein conductive layer 36 is a composite layer of tantalum nitride and copper, conductive layer 36 is polished using a slurry comprising hydrogen peroxide, deionized water, and a silica abrasive in order to form conductive members 38. In one embodiment, conductive members 38 are contact or via plugs which are electrically shorted to conductive members 28. In an alternative embodiment, conductive members 38 are interconnect lines that are electrically shorted to conductive members 28. Note, a portion 40 of conductive layer 36 may also optionally be left around the perimeter of integrated circuit structure 12, as shown in FIG. 5.

Figure 6:
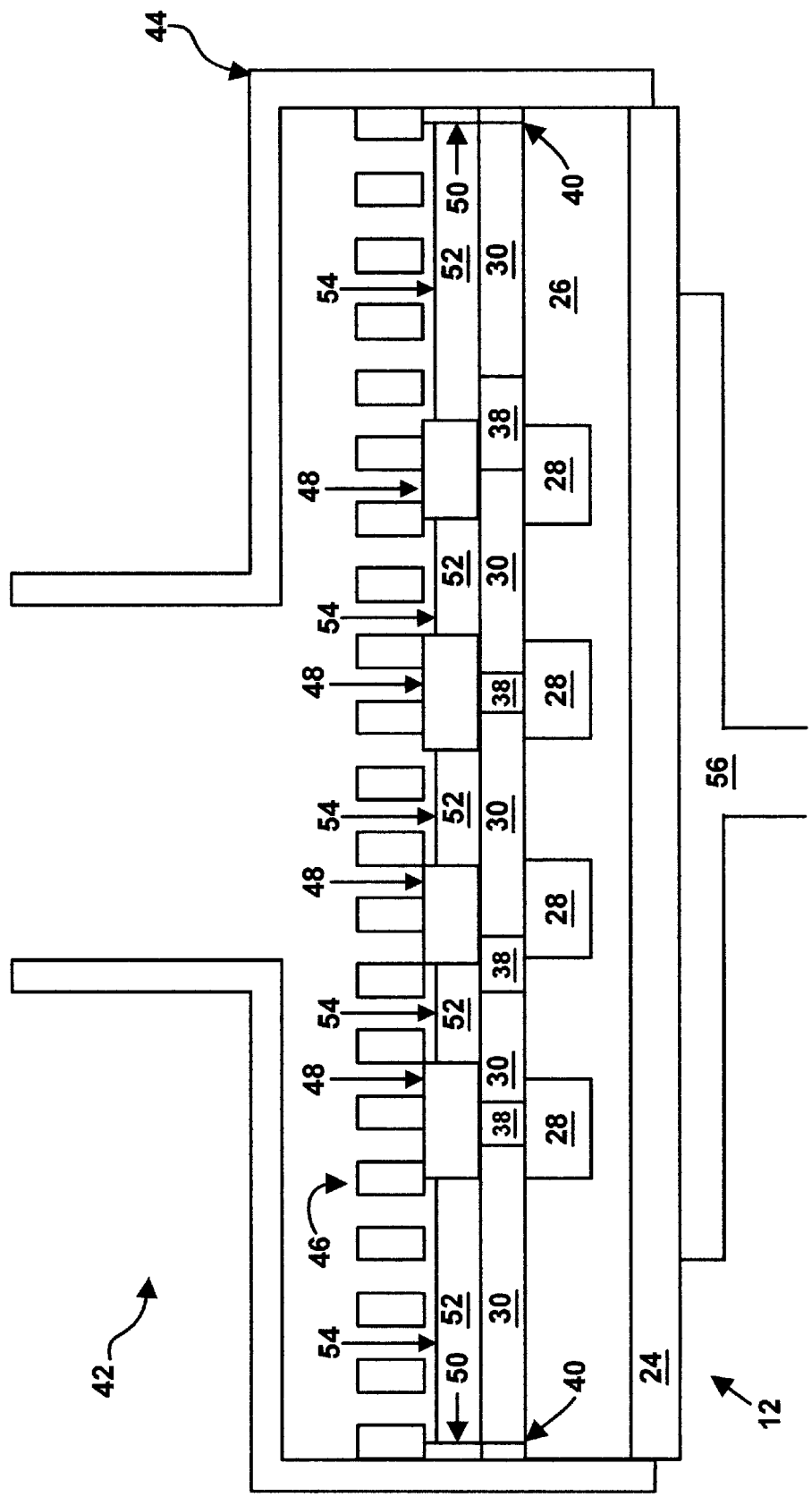

In FIG. 6, a masking chuck 42 is placed in contact with integrated circuit structure 12 of FIG. 5. In this particular embodiment, masking chuck 42 comprises a housing 44 which is analogous to housing 16 of FIG. 1, a perforated plate 46 which is analogous to perforated plate 18 of FIG. 1, patterned masking regions 48 analogous to patterned masking regions 20 of FIG. 1, and an edge ring 50 analogous to edge ring 22 of FIG. 1. Masking chuck 42 is aligned to integrated circuit structure 12, as previously discussed above, such that patterned masking regions 48 overlie and abut a portion of conductive members 38. Masking chuck 42 is then used to deposit a dielectric layer 52 over a portion of substrate 24. Note, a predetermined amount of dielectric material is deposited so that the gaps between patterned masking regions 48 are filled, and the top surface 54 of dielectric layer 52 lies below perforated plate 46, as shown in FIG. 6. In one embodiment, a hydrogen silsesquioxane (HSQ) based inorganic polymer is flowed through masking chuck 42 in order to form dielectric layer 52. It should be appreciated that integrated circuit structure 12 and masking chuck 42 may be rotated by substrate chuck 56 when dielectric layer 52 is deposited, so that dielectric layer 52 uniformly fills the gaps between patterned masking regions 48.

After deposition, dielectric layer 52 is then cured. In one embodiment, substrate chuck 56 comprises a resistive heater and dielectric layer 52 is heated by substrate chuck 56 in order to cure it. In one embodiment, masking chuck 42 also exposes dielectric layer 52 to an inert gas, such as nitrogen, argon, or helium, while it is heated. In an alternative embodiment, housing 44 comprises a resistive heater and dielectric layer 52 is heated by housing 44, while masking chuck 42 exposes it to an inert gas, such as nitrogen, argon, or helium. In the particular embodiment, wherein dielectric layer 52 is formed using a HSQ based inorganic polymer, dielectric layer 52 may be cured at a temperature ranging from approximately 350 degrees Celsius to approximately 450 degrees Celsius, in a nitrogen, argon, or helium atmosphere for a time period ranging from approximately 25 minutes to approximately 45 minutes. It should be appreciated that HSQ based inorganic polymers can also be cured using different curing times and temperatures.

Figure 7:
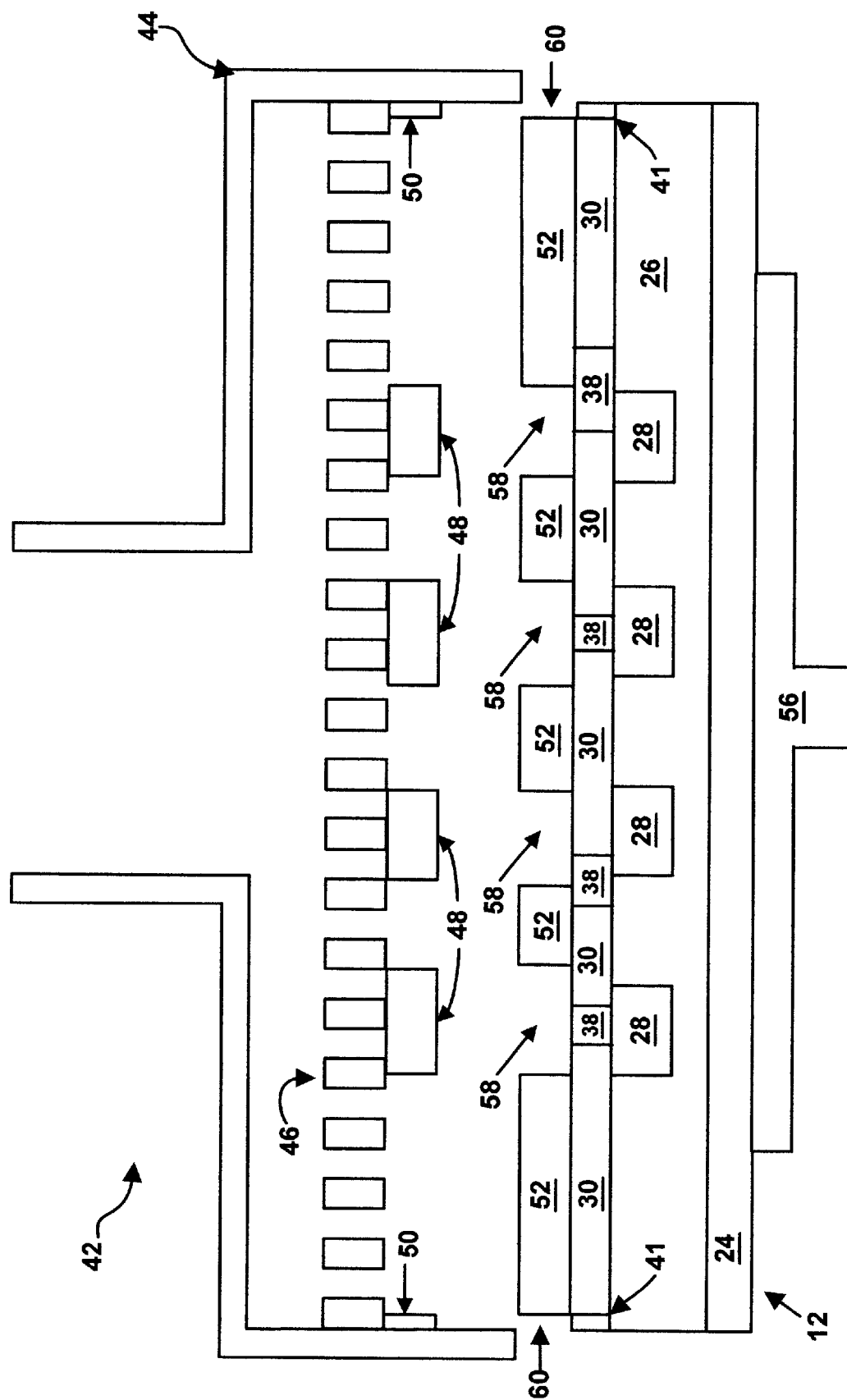

In FIG. 7, masking chuck 42 is then separated from integrated circuit structure 12 to form openings 58 within dielectric layer 52. Note, openings 58 are formed because dielectric layer 52 does not adhere to patterned masking regions 48. Dielectric layer 52 also does not adhere to edge ring 50, and thus a small gap 60 is also formed around the perimeter of integrated circuit structure 12 when masking chuck 42 is separated from integrated circuit structure 12, as previously discussed above. Note that openings 58 are also formed without subjecting integrated circuit structure 12 to a plasma process. Therefore, plasma process induced damage to integrated circuit structure 12 is minimized with the present invention.

Figure 8:
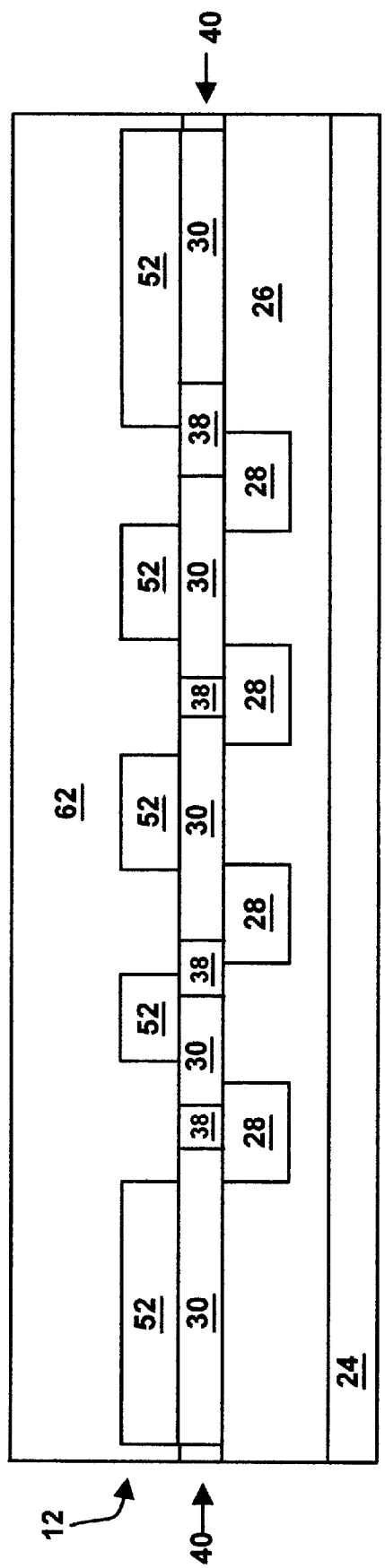

In FIG. 8, a conductive layer 62 is then formed overlying substrate 24. Conductive layer 62 overlies dielectric layer 52 and lies within openings 58, such that openings 58 are substantially filled by conductive layer 62. Conductive layer 62 may be a metal nitride layer, such as titanium nitride, tantalum nitride, tungsten nitride, tantalum-silicon nitride, or the like, or a metal layer, such titanium, tantalum, tungsten, aluminum, an aluminum-alloy, copper, or the like. In addition, conductive layer 62 may be a composite conductive layer comprising any combination of the foregoing conductive materials. For example, conductive layer 62 may be a composite layer of titanium nitride and tungsten, or a composite layer of tantalum nitride and copper.

Figure 9:
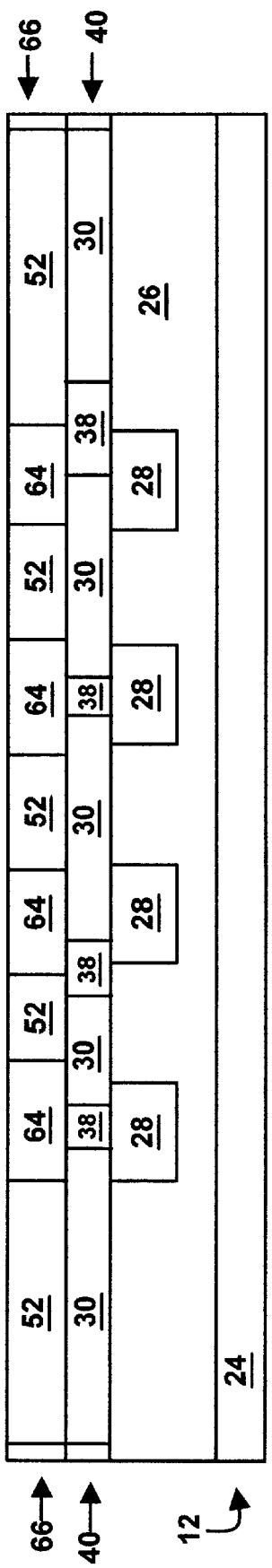

In FIG. 9, conductive layer 62 is then polished to form conductive members 64 within openings 58. In one embodiment, wherein conductive layer 62 is a composite layer of titanium nitride and tungsten, conductive layer 62 is polished using a slurry comprising ferric nitrate, deionized water, and a silica abrasive in order to form conductive members 64. Alternatively, the composite layer of tungsten and titanium nitride may also be polished using a slurry comprising hydrogen peroxide, deionized water, and a silica abrasive. In an alternative embodiment, wherein conductive layer 62 is a composite layer of tantalum nitride and copper, conductive layer 62 is polished using a slurry comprising hydrogen peroxide, deionized water, and a silica abrasive in order to form conductive members 64. In one embodiment, conductive members 64 are contact or via plugs that are electrically shorted to conductive members 38. In an alternative embodiment, conductive members 64 are interconnect lines that are electrically shorted to conductive members 38. Note, a portion 66 of conductive layer 62 may also optionally be left around the perimeter of integrated circuit structure 12, as shown in FIG. 9.

Figure 10:
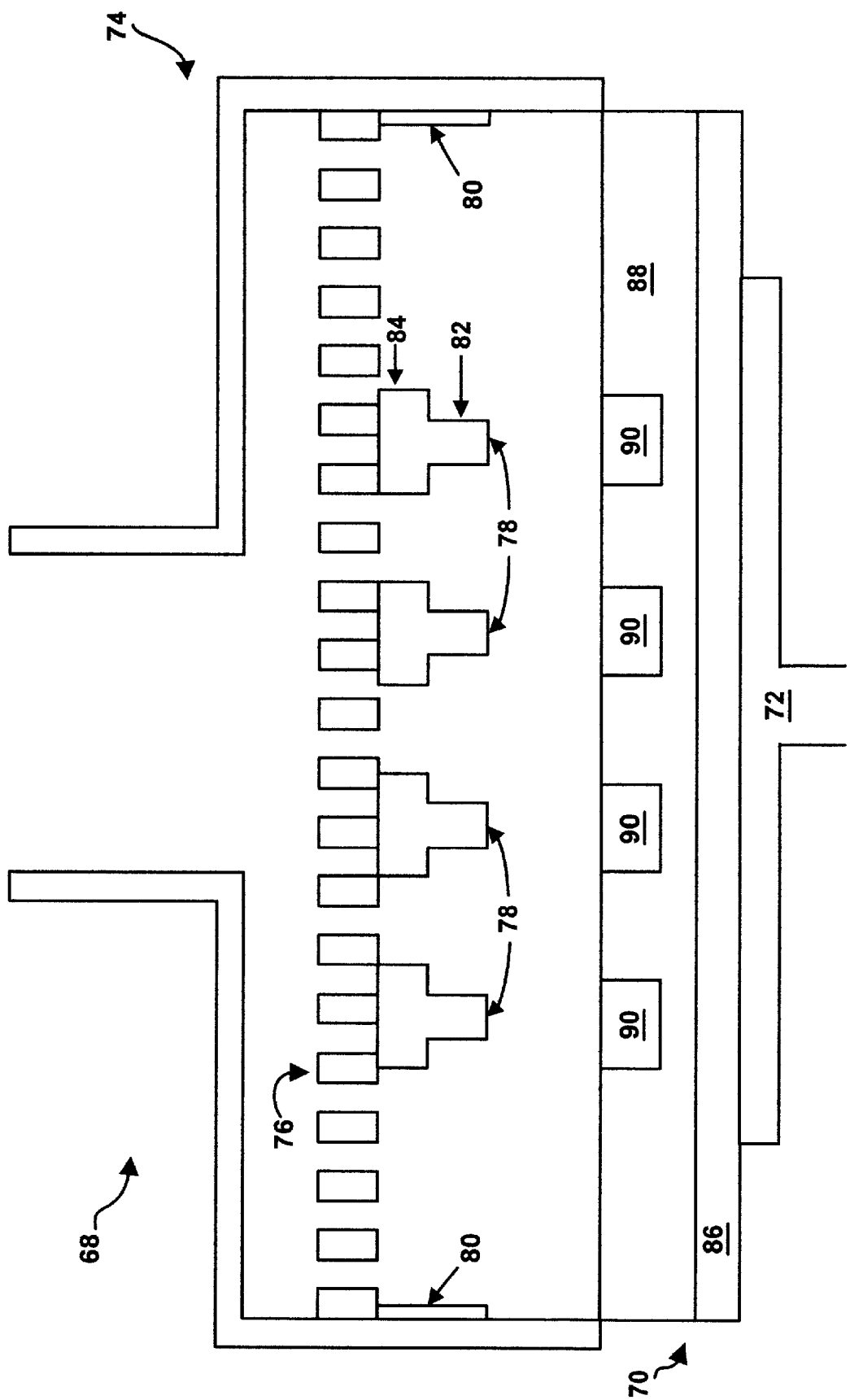
FIGS. 10–14 illustrate, in cross-section, process steps in accordance with another embodiment of the present invention.

FIGS. 10 through 14, illustrate in cross-section, process steps for forming an interconnect structure in accordance with an alternative embodiment of the present invention. Shown in FIG. 10, is a portion of a masking chuck 68, a portion of an integrated circuit structure 70, and a portion of a substrate chuck 72.

In this particular embodiment, masking chuck 68 comprises a housing 74, a perforated plate 76, patterned masking regions 78, and an edge ring 80. In one embodiment, stainless steel is used to form housing 74 and perforated plate 76. In an alternative embodiment, perforated plate 76 is formed using silicon (Si) or silicon carbide (SiC). In this particular embodiment, patterned masking regions 78 comprise a via portion 82 and an interconnect line portion 84. In one embodiment, patterned masking regions 78 and edge ring 80 are formed using polyimide, and conventional photolithographic patterning and etching processes are used to patterned the polyimide.

In this particular embodiment, integrated circuit structure 70 comprises a substrate 86 analogous to substrate 24 of FIG. 1, a dielectric layer 88 analogous to dielectric layer 26 Of FIG. 1, and conductive members 90 analogous to conductive members 28 of FIG. 1.

Figure 11:
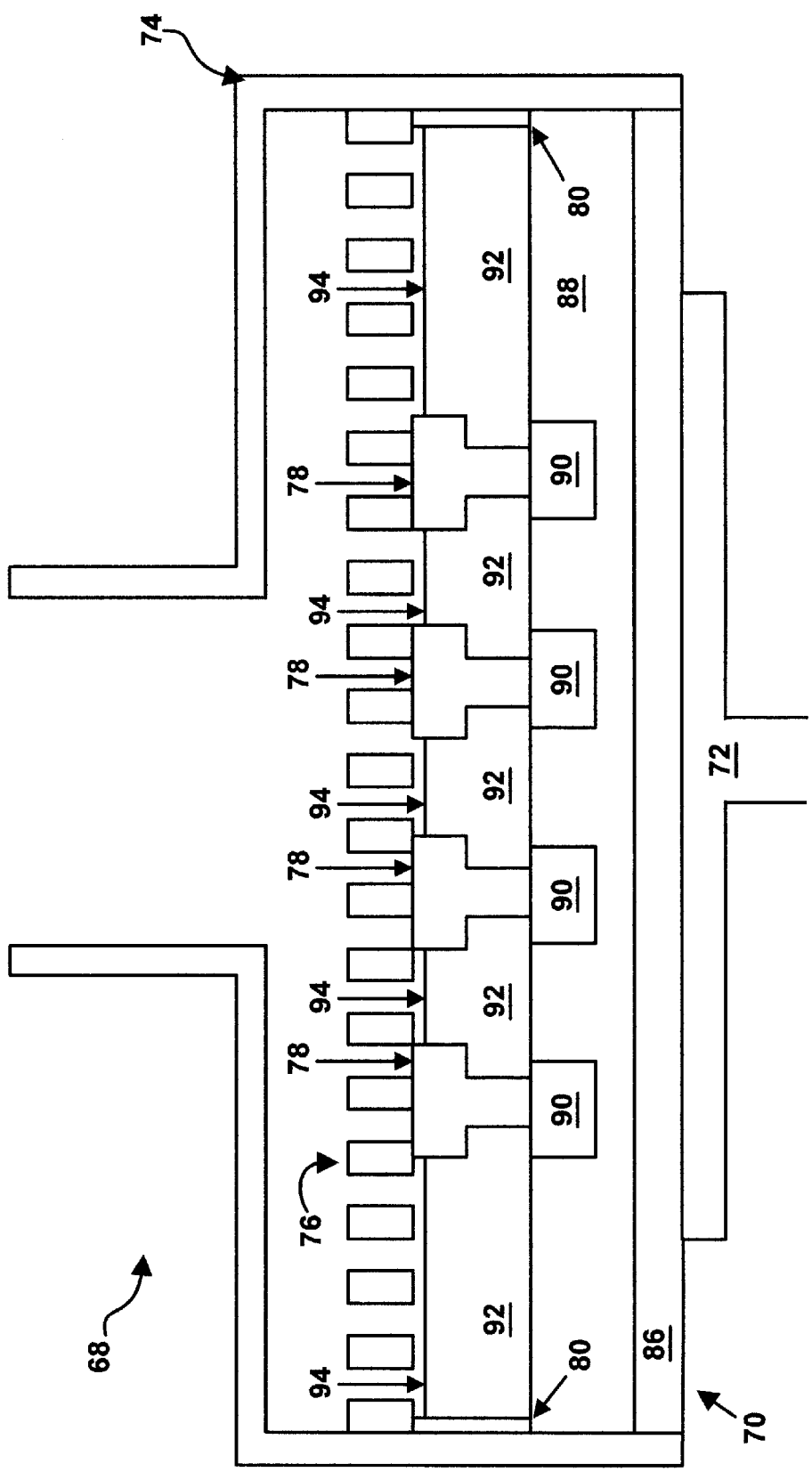

In FIG. 11, masking chuck 68 is placed in contact with integrated circuit structure 70, such that patterned masking regions 78 overlie and abut a portion of conductive members 90. Masking chuck 68 is aligned to integrated circuit structure 70, as previously discussed above, and then used to deposit a dielectric layer 92 over a portion of substrate 86. Note, a predetermined amount of dielectric material is deposited so that the gaps between patterned masking regions 78 are filled, and the top surface 94 of dielectric layer 92 lies below perforated plate 76, as shown in FIG. 11. In one embodiment, a hydrogen silsesquioxane (HSQ) based inorganic polymer is flowed through masking chuck 68 in order to form dielectric layer 92. It should be appreciated that integrated circuit structure 70 and masking chuck 68 may be rotated by substrate chuck 72 when dielectric layer 92 is deposited, so that dielectric layer 92 uniformly fills the gaps between patterned masking regions 78.

After deposition, dielectric layer 92 is then cured. In one embodiment, substrate chuck 72 comprises a resistive heater and dielectric layer 92 is heated by substrate chuck 72 in order to cure it. In one embodiment, masking chuck 68 also exposes dielectric layer 92 to an inert gas, such as nitrogen, argon, or helium, while it is heated. In an alternative embodiment, housing 74 comprises a resistive heater and dielectric layer 92 is heated by housing 74, while masking chuck 68 exposes it to an inert gas, such as nitrogen, argon, or helium. In the particular embodiment, wherein dielectric layer 92 is formed using a HSQ based inorganic polymer, dielectric layer 92 may be cured at a temperature ranging from approximately 350 degrees Celsius to approximately 450 degrees Celsius, in a nitrogen, argon, or helium atmosphere for a time period ranging from approximately 25 minutes to approximately 45 minutes. It should be appreciated that HSQ based inorganic polymers can also be cured using different curing times and temperatures.

Figure 12:
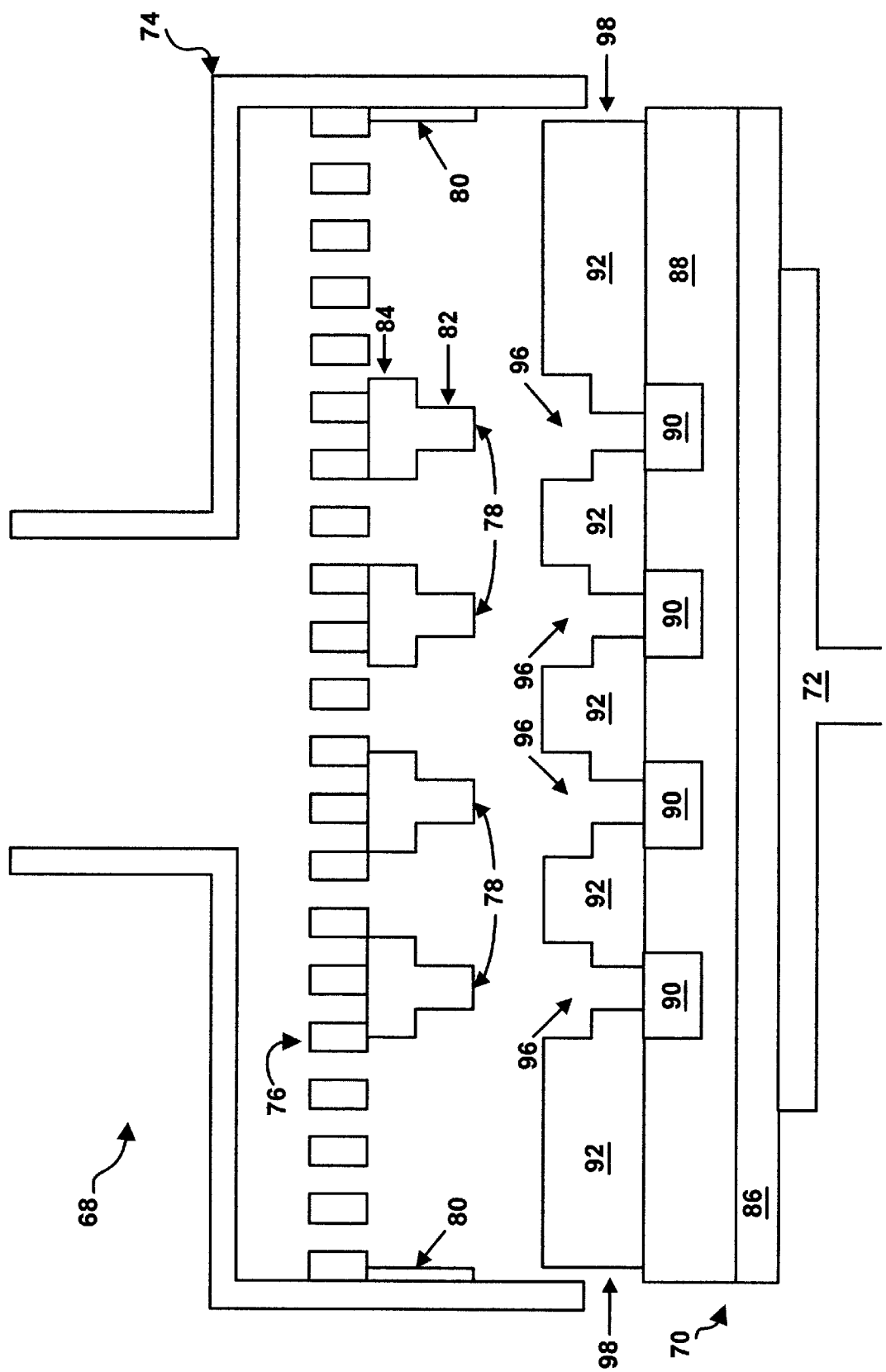

In FIG. 12, masking chuck 68 is then separated from integrated circuit structure 70 to form openings 96 within dielectric layer 92. Note, openings 96 are formed because dielectric layer 92 does not adhere to patterned masking regions 78. Dielectric layer 92 also does not adhere to edge ring 80, and thus a small gap 98 is also formed around the perimeter of integrated circuit structure 70 when masking chuck 68 is separated from integrated circuit structure 12, as previously discussed. Note that openings 96 are formed without subjecting integrated circuit structure 12 to a plasma process. Therefore, plasma process induced damage to integrated circuit structure 70 is minimized with the present invention.

Figure 13:
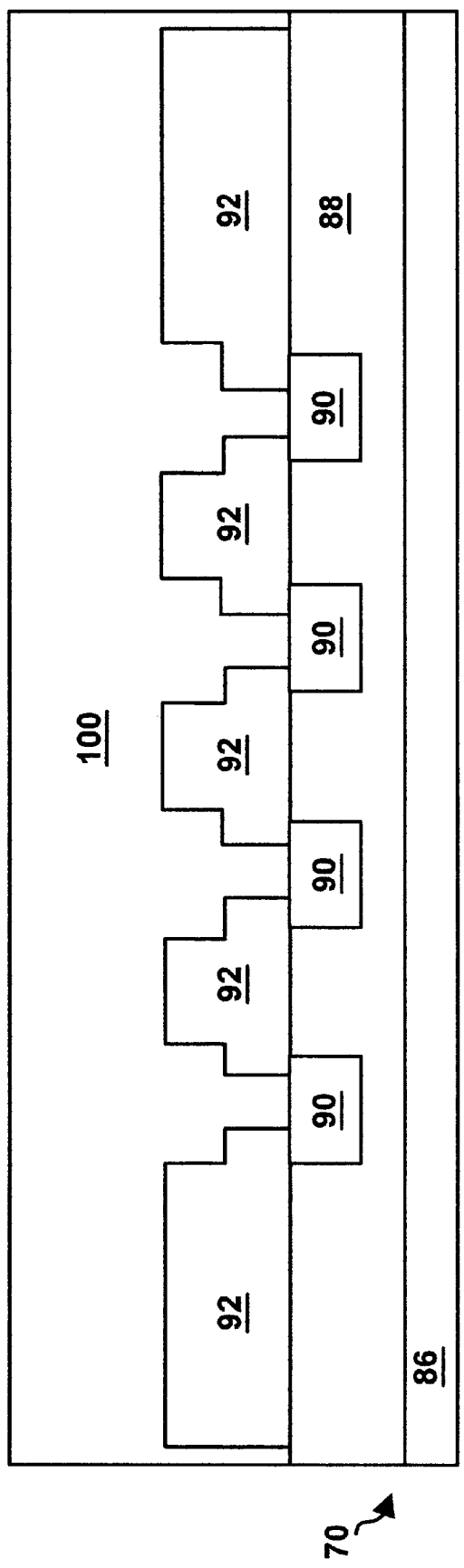

In FIG. 13, a conductive layer 100 is then formed overlying substrate 86. Conductive layer 100 overlies dielectric layer 92 and lies within openings 96, such that openings 96 are substantially filled by conductive layer 100. Conductive layer 100 may be a metal nitride layer, such as titanium nitride, tantalum nitride, tungsten nitride, tantalum-silicon nitride, or the like, or a metal layer, such titanium, tantalum, tungsten, aluminum, an aluminum-alloy, copper, or the like. In addition, conductive layer 100 may be a composite conductive layer comprising any combination of the foregoing conductive materials. For example, conductive layer 100 may be a composite layer of titanium nitride and tungsten, or a composite layer of tantalum nitride and copper.

Figure 14:
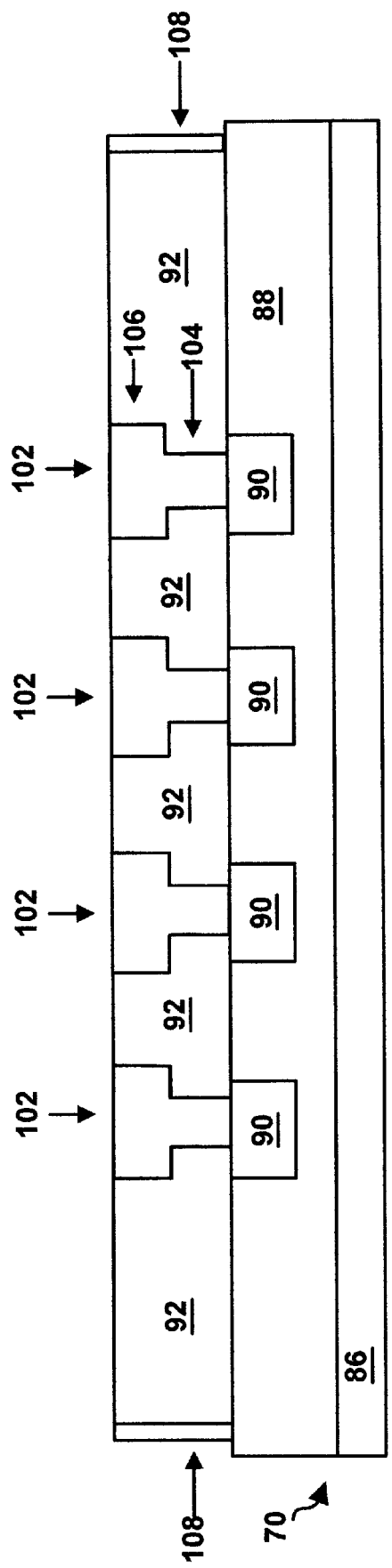

In FIG. 14, conductive layer 100 is then polished to form conductive members 102 within openings 96. Note, conductive members 102 comprise a via portion 104 and an interconnect line portion 106 and they are electrically shorted to conductive members 90. In one embodiment, wherein conductive layer 100 is a composite layer of titanium nitride and tungsten, conductive layer 100 is polished using a slurry comprising ferric nitrate, deionized water, and a silica abrasive in order to form conductive members 102. Alternatively, the composite layer of tungsten and titanium nitride may also be polished using a slurry comprising hydrogen peroxide, deionized water, and a silica abrasive. In an alternative embodiment, wherein conductive layer 100 is a composite layer of tantalum nitride and copper, conductive layer 100 is polished using a slurry comprising hydrogen peroxide, deionized water, and a silica abrasive in order to form conductive members 102. Note, a portion 108 of conductive layer 100 may also optionally be left around the perimeter of integrated circuit structure 70, as shown in FIG. 14.

It should be appreciated that the process steps illustrated in FIGS. 10 through 14 may be repeated to form additional levels of metallization.

Thus it is apparent that there has been provided, in accordance with the present invention, a method for forming an interconnect structure that fully meets the need and advantages set forth previously. Although the invention has been described and illustrated with reference to specific embodiments thereof, it is not intended that the invention be limited to these illustrative embodiments. Those skilled in the art will recognize that modifications and variations can be made without departing from the spirit of the invention. Therefore, it is intended that this invention encompass all such variations and modifications as fall within the scope of the appended claims.

What is claimed is:

1. A method for forming an interconnect structure comprising the steps of:
   providing a substrate;
   providing a masking chuck;
   placing the masking chuck in contact with the substrate;
   using the masking chuck to deposit a dielectric layer on the substrate, while the masking chuck is in contact with the substrate;
   removing the masking chuck from the substrate to define an opening in the dielectric layer;
   depositing a conductive layer in the opening; and
   removing a portion of the conductive layer to form a conductive member in the opening.

2. The method of claim 1, wherein the substrate is a printed circuit board.

3. The method of claim 1, wherein the substrate is a semiconductor substrate.

4. The method of claim 1, wherein the dielectric layer comprises hydrogen silsesquioxane (HSQ).

5. The method of claim 1, wherein the conductive layer comprises copper.

6. The method of claim 1, wherein the step of removing the portion of the conductive layer comprises the step of polishing the conductive layer.

7. A method for forming an interconnect structure comprising the steps of:

providing a substrate;

providing a first masking chuck;

placing the first masking chuck in contact with the substrate;

using the first masking chuck to deposit a first dielectric layer on the substrate, while the first masking chuck is in contact with the substrate;

removing the first masking chuck from the substrate to define a first opening in the first dielectric layer;

depositing a first conductive layer in the first opening;

removing a portion of the first conductive layer to form a first conductive member in the first opening;

providing a second masking chuck;

placing the second masking chuck in contact with the substrate;

using the second masking chuck to deposit a second dielectric layer overlying the first dielectric layer, while the second masking chuck is in contact with the substrate;

removing the second masking chuck from the substrate to define a second opening in the second dielectric layer;

depositing a second conductive layer in the second opening;

removing a portion of the second conductive layer to form a second conductive member in the second opening, wherein the first conductive member and the second conductive member are electrically shorted to each other.

8. The method of claim 7, wherein the substrate is a printed circuit board.

9. The method of claim 7, wherein the substrate is a semiconductor wafer.

10. The method of claim 7, wherein the first dielectric layer comprises hydrogen silsesquioxane (HSQ).

11. The method of claim 7, wherein the first conductive layer comprises copper.

12. The method of claim 7, wherein the step of removing the portion of the first conductive layer comprises the step of polishing the first conductive layer.

13. The method of claim 7, wherein the second dielectric layer comprises hydrogen silsesquioxane (HSQ).

14. The method of claim 7, wherein the second conductive layer comprises copper.

15. The method of claim 7, wherein the step of removing the portion of the second conductive layer comprises the step of polishing the second conductive layer.

16. A method for forming an interconnect structure comprising the steps of:

providing a substrate;

providing a first masking chuck;

placing the first masking chuck in contact with the substrate;

using the first masking chuck to deposit a first dielectric layer on the substrate, while the first masking chuck is in contact with the substrate;

removing the first masking chuck from the substrate to define a first opening in the first dielectric layer, wherein the first opening comprises a via portion and an interconnect line portion;

depositing a first conductive layer in the first opening; and removing a portion of the first conductive layer to form a first conductive member in the first opening.

17. The method of claim 16, further comprising the steps of:

providing a second masking chuck;

placing the second masking chuck in contact with the substrate;

using the second masking chuck to deposit a second dielectric layer overlying the first dielectric layer, while the second masking chuck is in contact with the substrate;

removing the second masking chuck from the substrate to define a second opening in the second dielectric layer, wherein the second opening comprises a via portion and an interconnect line portion;

depositing a second conductive layer in the second opening;

removing a portion of the second conductive layer to form a second conductive member in the second opening, wherein the first conductive member and the second conductive member are electrically shorted to each other.

18. The method of claim 16, wherein the substrate is a printed circuit board.

19. The method of claim 16, wherein the substrate is a semiconductor substrate.

20. The method of claim 16, wherein the first dielectric layer comprises hydrogen silsesquioxane (HSQ).

21. The method of claim 16, wherein the first conductive layer comprises copper.

22. The method of claim 16, wherein the step of removing the portion of the first conductive layer comprises the step of polishing the first conductive layer.

* * * * *